United States Patent
Couet et al.

(10) Patent No.: US 11,545,621 B2
(45) Date of Patent: Jan. 3, 2023

(54) LAYER STACK FOR MAGNETIC TUNNEL JUNCTION DEVICE

(71) Applicant: IMEC vzw, Leuven (BE)

(72) Inventors: Sebastien Couet, Grez-Doiceau (BE); Johan Swerts, Kessel-Lo (BE)

(73) Assignee: IMEC vzw, Leuven (BE)

( * ) Notice: Subject to any disclaimer, the term of this patent is extended or adjusted under 35 U.S.C. 154(b) by 195 days.

(21) Appl. No.: 15/930,272

(22) Filed: May 12, 2020

(65) Prior Publication Data
US 2020/0365195 A1    Nov. 19, 2020

(30) Foreign Application Priority Data

May 13, 2019 (EP) .................................... 19174175

(51) Int. Cl.

| | |
|---|---|
| *H01L 43/10* | (2006.01) |
| *G11C 11/16* | (2006.01) |
| *H01L 27/22* | (2006.01) |
| *H01L 43/02* | (2006.01) |
| *H01L 43/08* | (2006.01) |
| *H01L 43/12* | (2006.01) |
| *H01F 10/30* | (2006.01) |

(52) U.S. Cl.
CPC ............ *H01L 43/10* (2013.01); *G11C 11/161* (2013.01); *H01F 10/30* (2013.01); *H01L 27/222* (2013.01); *H01L 43/02* (2013.01); *H01L 43/08* (2013.01); *H01L 43/12* (2013.01)

(58) Field of Classification Search
CPC ......... H01L 43/02; H01L 43/08; H01L 43/10; G11C 11/161; G11C 2211/5615; H01F 10/06; H01F 10/12; H01F 10/13; H01F 10/30
See application file for complete search history.

(56) References Cited

U.S. PATENT DOCUMENTS

| | | | |
|---|---|---|---|
| 6,703,654 B1 | 3/2004 | Horng et al. | |
| 7,796,364 B2 * | 9/2010 | Lin ...................... | H01F 41/302 360/324.11 |
| 8,803,265 B2 | 8/2014 | Lim et al. | |
| 9,177,575 B1 | 11/2015 | Gao et al. | |
| 9,484,527 B2 | 11/2016 | Han et al. | |

(Continued)

FOREIGN PATENT DOCUMENTS

| | | |
|---|---|---|
| EP | 3 460 811 A1 | 3/2019 |
| KR | 10-1537469 | 7/2015 |
| WO | WO 2017/131584 A1 | 8/2017 |

OTHER PUBLICATIONS

Extended European Search Report dated Jan. 17, 2020 in counterpart Application No. EP 19174175.0.

*Primary Examiner* — Scott B Geyer
(74) *Attorney, Agent, or Firm* — Knobbe, Martens, Olson & Bear, LLP

(57) ABSTRACT

The disclosed technology relates generally to semiconductor devices, and more particularly to a layer stack for a magnetic tunnel junction (MTJ) device, and a method of forming the same. According to an aspect, a layer stack for a (MTJ) device comprises a seed layer structure, a pinning layer structure arranged above the seed layer structure, and above the pinning layer structure a Fe-comprising reference layer structure and a free layer structure separated by a tunnel barrier layer. The seed layer structure comprises a Ru-comprising layer and a Cr-comprising layer. The Cr-comprising layer forms an upper layer of the seed layer structure.

20 Claims, 1 Drawing Sheet

(56) References Cited

U.S. PATENT DOCUMENTS

| | | | |
|---|---|---|---|
| 9,673,385 B1 | 6/2017 | Liu et al. | |
| 10,050,083 B2 | 8/2018 | Gan et al. | |
| 10,468,457 B1 * | 11/2019 | Zeng | G11C 11/161 |
| 10,468,592 B1 * | 11/2019 | Xue | H01F 41/32 |
| 10,818,837 B1 * | 10/2020 | Otani | H01L 27/228 |
| 2006/0022227 A1 * | 2/2006 | Horng | H01F 41/307 |
| | | | 257/272 |
| 2008/0151442 A1 | 6/2008 | Mauri et al. | |
| 2012/0018824 A1 | 1/2012 | Lim et al. | |
| 2014/0103469 A1 * | 4/2014 | Jan | H01L 43/08 |
| | | | 257/E29.323 |
| 2015/0311427 A1 | 10/2015 | Gottwald et al. | |
| 2016/0211440 A1 * | 7/2016 | Siddik | G11C 11/161 |
| 2017/0244377 A1 | 8/2017 | Yamane et al. | |
| 2018/0130943 A1 | 5/2018 | Naik et al. | |
| 2018/0287052 A1 | 10/2018 | Wang et al. | |
| 2019/0006414 A1 * | 1/2019 | Huai | H01L 43/08 |
| 2019/0081234 A1 * | 3/2019 | Naik | H01L 27/226 |
| 2019/0122799 A1 | 4/2019 | Shum et al. | |
| 2019/0157549 A1 * | 5/2019 | Sun | G11C 11/16 |
| 2019/0279666 A1 * | 9/2019 | Freitag | G11B 5/6082 |
| 2020/0006425 A1 * | 1/2020 | Lin | H01L 43/12 |

* cited by examiner

LAYER STACK FOR MAGNETIC TUNNEL JUNCTION DEVICE

CROSS-REFERENCE TO RELATED APPLICATIONS

This application claims foreign priority to European Application No. 19174175.0, filed May 13, 2029, the content of which is incorporated by reference herein in its entirety.

BACKGROUND

Field

The disclosed technology relates generally to semiconductor devices, and more particularly to a layer stack for a magnetic tunnel junction (MTJ) device, and a method of forming the same.

Description of the Related Technology

Magnetoresistive random-access memory (MRAM) technology is a promising candidate for future memory technology. The data storing function of an MRAM device may be provided by MTJs. An MTJ allows data to be stored and read by controlling and sensing, respectively, the relative orientations of the magnetizations of free and reference layer structures of the MTJ.

To realize an MRAM device, MTJs may be integrated en masse in the back end of line (BEOL) interconnect structure of an integrated circuit. Device fabrication may typically comprise depositing MTJ layers, patterning MTJ pillars by lithography and etching, and connecting the MTJ pillars via metal interconnects of the interconnect structure. Forming the interconnection structure and the metal interconnects, which are often Cu-based, typically involves multiple steps at elevated temperatures, about 400° C. or greater for a duration of, e.g., 90-180 minutes for advanced nodes.

As the performance of an MTJ device is highly sensitive to even atomic level changes in composition and structure of the layers, it remains challenging however to fabricate MTJs having the ability to withstand the stress induced during the elevated temperatures of the BEOL processing, without degrading the performance of the MTJs.

SUMMARY OF CERTAIN INVENTIVE ASPECTS

An objective of the present inventive concept is accordingly to provide a layer stack for a MTJ device with an improved ability to withstand elevated temperatures, such as during BEOL processing. Further and alternative objectives may be understood from the following disclosure.

According to a first aspect of the disclosed technology, a layer stack for a magnetic tunnel junction (MTJ) device comprises a seed layer structure, a pinning layer structure arranged above the seed layer structure, and above the pinning layer structure, a Fe-comprising reference layer structure and a free layer structure separated by a tunnel barrier layer. The seed layer structure comprises a Ru-comprising layer and a Cr-comprising layer, wherein the Cr-comprising layer forms an upper layer of the seed layer structure.

According to a second aspect of the disclosed technology, a method for forming a layer stack for a magnetic tunnel junction (MTJ) device comprises forming a seed layer structure, forming a pinning layer structure above the seed layer structure, and forming, above the pinning layer structure, a Fe-comprising reference layer structure, a tunnel barrier layer, and a free layer structure. Forming the seed layer structure comprises forming a Ru-comprising layer and a Cr-comprising layer, wherein the Cr-comprising layer forms an upper layer of the seed layer structure. The method further comprises performing an anneal process, wherein Cr diffuses from the Cr-comprising layer into the pinning layer structure.

An MTJ may be configured as a "bottom-pinned" MTJ comprising, in a bottom-up direction, a reference layer structure, a tunnel barrier layer and a free layer structure, wherein the magnetization of the reference layer structure is "pinned" or "fixed" by an underlying pinning layer structure. A considerable amount of attention is currently directed to CoFeB-based bottom-pinned MTJs, in part because they enable fabrication of MTJs demonstrating a perpendicular magnetic anisotropy (PMA) and favourable magnetic and electric properties, for instance a high room-temperature tunnel magneto-resistance ratio (TMR). A CoFeB-based MTJ may comprise a CoFeB-, CoFe-, FeB-, or Fe-comprising reference layer structure and free layer structure, separated by an MgO-comprising tunnel barrier layer.

The disclosed technology is based on the insight that performance of an MTJ device comprising an MTJ layer stack with a bottom-pinned Fe-comprising reference layer structure (such as CoFeB, FeB, CoFe, or Fe) may be degraded, e.g., after being subjected to the elevated temperatures of typical BEOL process steps. It may be observed, for instance through energy-dispersive x-ray spectroscopy (EDX) experiments, that processing at elevated temperatures may cause Fe of the reference layer structure to diffuse into other layers and structures of the MTJ layer stack. Notably, without being bound to any theory, Fe from the Fe-comprising reference layer structure may diffuse into the pinning layer structure, causing a loss of anisotropy of the pinning layer structure which in turn may result in a reduced coercivity of the reference layer structure and consequently a reduced TMR. It is believed that a major portion of the diffusing Fe-atoms propagate along grain boundaries within the pinning layer system. The detrimental effects of the Fe-diffusion may be observed already in un-patterned blanket deposited layer structures but is expected to be even larger for etched structures. Due to stress relaxation after patterning, the grains may be less compressed and the grain boundaries may therefore be more prone to act as diffusion paths.

In accordance with the disclosed technology, the inventors have, however, identified that the inclusion of a seed layer structure comprising a Ru-layer and a Cr-layer, before or below the pinning layer structure in a bottom-pinned MTJ may provide a "diffusion blocking function" with respect to Fe. That is, the presence of the inventive seed layer structure may effectively reduce the Fe-diffusion into the pinning layer structure observed after processing at elevated temperatures:

Without being bound to any theory, the Cr-comprising layer may counteract a downward (e.g., thermally induced) diffusion of Fe into the pinning layer structure by providing in-diffusion of Cr into the pinning layer structure. It is contemplated that Cr may use the same paths for diffusion as Fe, e.g., along the grain boundaries of the pinning layer structure. Otherwise vacant locations on this path may now be occupied by Cr-atoms, thus reducing the extent to which Fe can diffuse into the pinning layer structure. This Fe-diffusion blocking function may result from a faster rate of diffusion of Cr-atoms into the pinning layer structure, than a rate of diffusion of the Fe-atoms.

Meanwhile, without being bound to any theory, the Ru-comprising layer may counteract a downward (e.g., thermally induced) diffusion of Cr. More specifically, the Ru-comprising layer, being located on the opposite side of the Cr-comprising layer in relation to the pinning layer structure, may serve to effectively direct or at least increase the tendency of Cr to diffuse upward into the pinning layer structure, thus further reducing the extent of the unwanted Fe-diffusion into the pinning layer structure.

The Cr-diffusion may be triggered by an anneal process, in accordance with the second aspect. However, Cr-diffusion may also occur during elevated process steps performed subsequent to the fabrication of the layer stack, in particular during BEOL processing.

As an effect of the reduced Fe-diffusion, device performance degradation due to elevated temperature processing may accordingly be avoided or at least reduced.

The inventive layer stack is suitable for use in an MTJ device. An MTJ device may comprise a substrate and an interconnect structure arranged on the substrate, wherein the layer stack may be arranged in the interconnect structure, e.g., by being embedded in a dielectric layer structure of the interconnect structure.

The inventive layer stack and fabrication method thereof is suitable for MTJ devices for MRAM devices. A MTJ device according to the present inventive concept may however also be suitable for MTJ devices for magnetoresistive spin logic devices, enabling implementation of typical Boolean logic operations.

In the present disclosure, the wording one layer or structure being arranged or formed above another layer or structure is used to define that said one layer or structure is arranged at a level above said other layer or structure as seen along a bottom-up direction of the layer stack. The term bottom-up direction refers to the stacking direction of the layers of the layer stack, e.g., the direction along which layers or structures are subsequently deposited or formed in the layer stack, or arranged relative to a substrate supporting the layer stack. The terminology bottom-up direction does hence not refer to an absolute orientation of the layers and structures but to a relative ordering or a sequence of the layers and structures forming the MTJ device layer stack, or the sequence in which the layers and structures are formed. Hence, with respect to a substrate supporting the layer stack, a layer or structure arranged above another layer or structure is accordingly arranged farther away from the substrate than said other layer or structure.

Similarly, a layer denoted as an "upper" or "top" layer of a structure refers to its position in the structure, as seen along the bottom-up direction. This applies correspondingly to a structure denoted as an "upper" or "top" structure of e.g. the layer stack or device.

It should be understood that a corresponding bottom-up frame of reference applies for terms such as "lower," "below," "bottom" and "downward."

As used herein, the term layer structure, such as the seed layer structure, the pinning layer structure, the reference layer structure and the free layer structure, refers to a structure including one or more layers, e.g., a single layer, or a composite layer of two or more layers or different materials/compositions.

The Cr-comprising layer of the seed layer structure may preferably be a Cr-layer, e.g., a layer of Cr. As may be appreciated, in the present context a layer of an element X (e.g., a Cr-layer) does not exclude presence of small amounts of other specifies, introduced in said layer for instance as impurities during layer formation or through in-diffusion from an adjacent layer. Hence a layer of element X may be understood at least substantially consisting of said element X. According to an alternative, the Cr-comprising layer may be a layer of a Cr-comprising alloy. A Cr-content of the alloy may preferably be at least 50%, allowing the layer to be at least substantially non-magnetic.

Further, the Ru-comprising layer of the seed layer structure may preferably be a Ru-layer, e.g., a layer of Ru.

The Cr-comprising layer of the seed layer structure may be arranged or formed on the Ru-comprising layer. By arranging the Cr-comprising layer on, e.g., in contact with, the Ru-comprising layer, the aforementioned effect of directing or at least increasing the tendency of Cr to diffuse upward, into the pinning layer structure, may be emphasized.

The Ru-comprising layer may be formed with a thickness in the range of 0.2 to 3 nm, more preferably between 0.5 and 2 nm, and the Cr-comprising layer may be formed with a thickness in the range of 0.2 to 2 nm, or more preferably between 0.5 and 1.5 nm. Ru- and Cu-comprising layers in this thickness range allow providing a seed layer structure with an appreciable degree of Fe-blocking function without overly increasing a total height of layer stack. Increasing the thickness of the Cr-comprising layer may reduce the effectiveness of the seed layer structure to induce a proper texture to the pinning layer structure.

The seed layer structure may further comprise a Pt-, Pd- or Ir-comprising bottom layer arranged below the Ru-comprising layer. With reference to the method of the second aspect, the forming of the seed layer structure may comprise forming a Pt-, Pd- or Ir-comprising bottom layer and subsequently forming the Ru-comprising layer above the bottom layer.

A bottom layer comprising Pt, Pd or Ir may serve to provide a robust and efficient seed function for forming the pinning layer structure and further structures.

The bottom layer may preferably be a Pt-layer, a Pd-layer or a Ir-layer, e.g., a layer of Pt, Pd or Ir. Pt-, Pd- and Ir-layers are generally reactively stable, and are generally less prone to forming surface oxides, and feature atomically smooth surfaces. This is advantageous for forming high quality layers and structures with a well-defined thickness.

The crystal structure of Pt-, Pd- or Ir-layers correspond to the face-centered cubic (FCC) and the surface of a Pt, Pd or Ir layer may be a (111) surface, thereby providing a suitable crystal texture or template for the above layers.

The bottom layer may be formed with a thickness in the range of 1 to 6 nm, preferably 2-5 nm. This allows the bottom layer to efficiently provide a texture inducing function for subsequent layers.

The Ru-comprising layer may form an interfacial layer between the bottom layer and the Cr-comprising layer. Thereby, three constituent layers of the seed layer structure (e.g., a Pt-, Pd- or Ir-comprising layer, a Ru-comprising layer, and a Cr-comprising layer) may be arranged consecutively without any intermediate layers in between. This three-layered seed layer structure may hence provide the aforementioned Fe-diffusion blocking and seed function without overly increasing a total height of the layer stack.

The pinning layer structure may comprise a Co/Pt laminate, a Co/Ni laminate, a CoFe/Pt laminate or a CoFe/Ni laminate. The pinning layer structure may comprise a CoPt-, a CoFePt-, a CoNi-, or a CoFeNi-alloy. These materials enable forming of a high-coercivity pinning layer structure.

As may be appreciated from the above discussion, the pinning layer structure of the layer stack may comprise Cr, e.g., diffused Cr, at least subsequent to an anneal process and/or BEOL process steps. Thus, it is expected that any completed device having gone through BEOL processing at elevated temperatures should exhibit at least some Cr content in the pinning layer structure.

According to embodiments of the second aspect of the present inventive concept, the method further comprises patterning the layer stack to form one or more pillar structures prior to or subsequent to performing the anneal process. Forming pillar structures out of the layer stack may be performed to define a plurality of MTJ devices.

The method may comprise forming layers and structures of the layer stack including the seed layer structure, the pinning layer structure, the reference layer structure, the tunnel barrier layer and the free layer structure, and subsequently patterning the layer stack to obtain a pillar structure. The act of patterning of the layer stack may include forming a mask above the layer stack and etching regions of the layer stack exposed by the mask, thereby forming one or more pillars.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

Figure 1A:
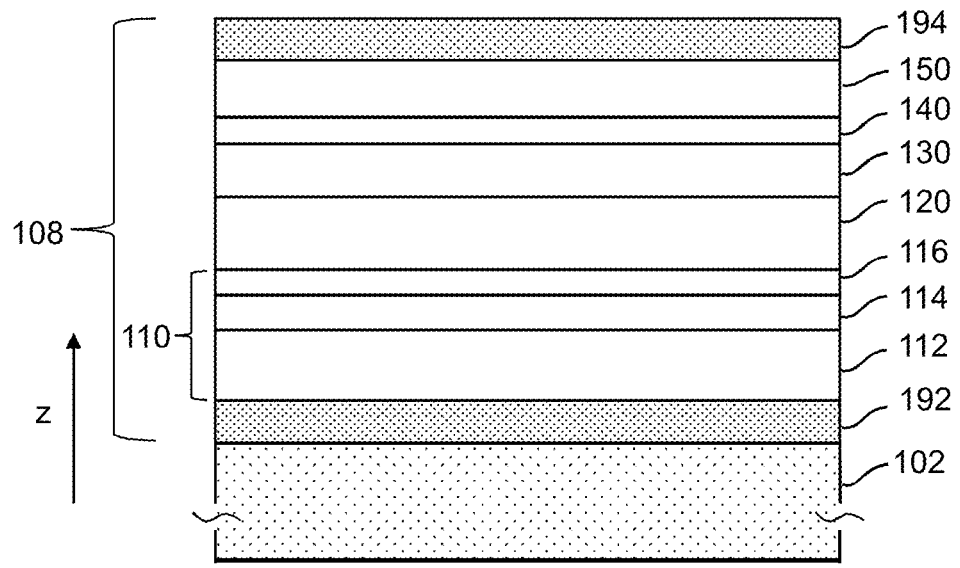
FIGS. 1a and b schematically illustrate cross sections of a MTJ device prior to and subsequent to a patterning step, respectively, according to embodiments.
Figure 1B:
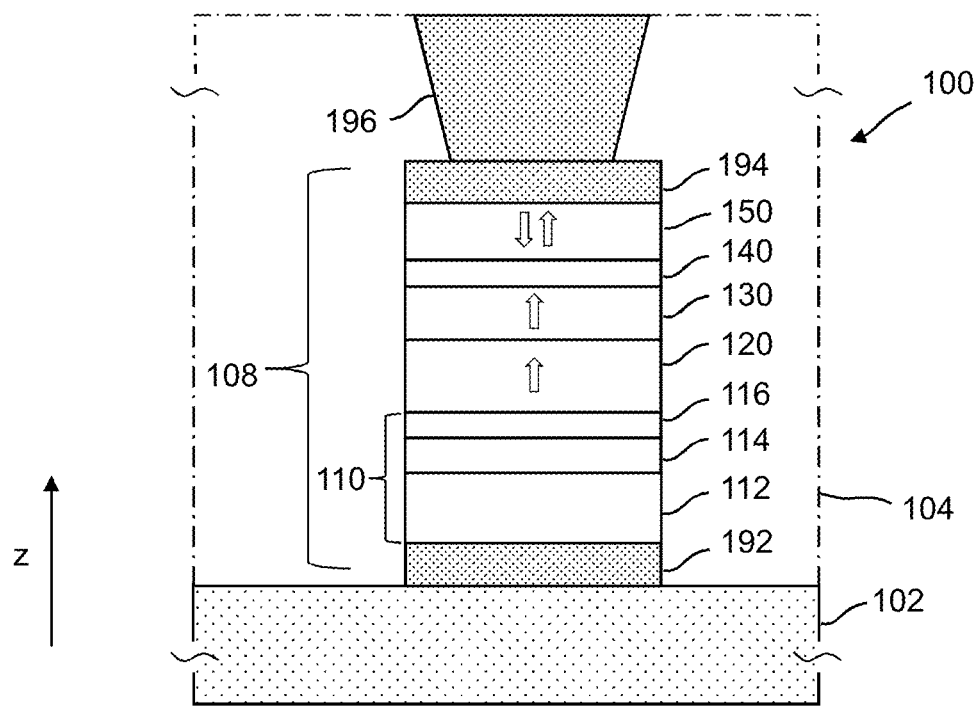

A layer stack 108 for an MTJ device 100 will now be disclosed with reference to FIGS. 1a-1b.

FIG. 1a depicts the layer stack 108 after layer deposition. FIG. 1b depicts the layer stack 108 after being subjected to a patterning step to form one or more MTJ device pillars. The figures represent cross-sections extending parallel to the stacking direction of the layers of the layer stack 108. The stacking direction, which also may be referred to as a bottom-up direction or vertical direction, is indicated by z. It should be noted that the layers may extend vertically and/or horizontally beyond the illustrated portions. It should also be noted that for the purpose of clarity the various layers and other features of the stacks are not drawn to scale and their relative dimensions, in particular their thickness, may differ from a physical stack. Typically, unless stated otherwise in the following, each of the layers of the stack may be formed with a thickness of a few Å to a few tens of Å.

The layer stack 108 comprises as shown a seed layer structure 110. A pinning layer structure 120 is arranged above the seed layer structure 110. A reference layer structure 130 is arranged above the pinning layer structure 120. As will be further described in the following, the reference layer structure 130 comprises Fe. A free layer structure 150 is arranged above the reference layer structure 130 and is separated therefrom by a tunnel barrier layer 140. The seed layer structure 110 is adapted to act as a seed structure for the pinning layer structure while providing an Fe-diffusion blocking function, as discussed above and to be further discussed below. Various compositions of the seed layer structure 110 are possible, as will be set out below. At least, the seed layer structure 110 comprises a Ru-comprising layer 114 and a Cr-comprising layer 116 forming an upper layer of the seed layer structure 110.

The layer stack 108 may as shown be supported by a substrate 102. The substrate 102 may comprise a semiconductor substrate. Examples of semiconductor substrates include a Si substrate, a Ge substrate, a SiGe substrate, a SiC substrate, a silicon-on-insulator (SOI) substrate, a germanium-on-insulator (GeOI) substrate, a silicon-germanium-on-insulator (SiGeOI) substrate to name a few. The substrate 102 may have been subjected to front-end-of-line (FEOL) processing to define an active device layer comprising active devices, such as transistor devices e.g., metal-oxide-semiconductor field-effect transistors (MOSFETs), metal-insulator-semiconductor field-effect transistors (MISFETs), bipolar junction transistors (BJTs), junction bipolar transistors (JBTs), fin field-effect transistors (FinFETs), nanowire field-effect transistors (FETs). The transistors may be used to implement circuitry for reading and writing operations of MTJ devices which are to be formed.

Although not shown in FIG. 1a, one or more levels of a BEOL-interconnect structure may be formed above the substrate 102, e.g., on the active device layer, on which the layer structure 108 in turn may be formed. An interconnect level may comprise horizontal metal lines and vertical metal vias, which may be formed of, for instance, Cu, W, Au, Ag, Al, Co or Ru. The metal lines and vias may be embedded in a dielectric material, typically comprising silicon oxide or other conventional low-k dielectric material. One or more of the interconnection levels may for example define read and write lines for the MTJ devices. The BEOL-portion may be formed using conventional BEOL-processing. As will be further described BEOL-processing may alternatively or additionally be performed after forming of the device.

The layer stack 108 may be formed on a BEOL-interconnect layer or the active device layer. Each one of the layers and layer structures of the layer stack 108 may be deposited, for instance by sputtering or evaporation or other suitable thin-film deposition techniques.

The layer stack 108 may as shown comprise a bottom electrode layer 192. The bottom electrode layer 192 may be a deposited layer comprising Ta, Ti, TaN, TiN, or combinations thereof. The bottom electrode layer 192 may be formed on and in contact with a conductive structure such as a metal line or via of a BEOL-interconnect layer or a contact of an active device of the active device layer.

The seed layer structure 110 may be arranged on the bottom electrode layer 192. It is, however, envisaged that a bottom electrode layer 192 may be omitted wherein the seed layer structure 110 may be arranged directly on a conductive structure such as a metal line, via or device contact.

The seed layer structure 110 may as shown comprise a bottom layer 112, below the Ru-comprising layer 114. In embodiments where the bottom electrode layer 192 is present, the bottom layer 112 may be formed thereon. The bottom layer 112 may be a deposited layer of Pt, Pd or Ir, or a combination of two or more deposited layers of Pt, Pd or Ir. The bottom layer 112 may be formed with a thickness in the range of 1 to 6 nm, preferably in the range of 2 to 5 nm. The bottom layer 112 may more generally be adapted to act as a texture inducing layer of the seed layer structure 110, such that a (111) texture may be induced in the pinning layer structure 120.

The Ru-comprising layer 114 may be a deposited layer of Ru. In the figures, the Ru-comprising layer 114 is arranged above the bottom layer 112, e.g., by being arranged on the bottom layer 112. However, in embodiments in which a layer stack omits the bottom layer 112, the Ru-comprising layer 114 may form the bottommost layer of the layer stack 108. The Ru-comprising layer 114 may be formed with a thickness in the range of 0.2 to 3 nm, preferably in the range of 0.5 to 2 nm. The Ru-comprising layer 114 may act as a Cr-diffusion barrier. More specifically, the Ru-comprising layer may counteract a downward thermally induced diffusion of Cr from the Cr-comprising layer 116. A downward Cr-diffusion could otherwise result in Cr diffusion into the bottom layer 112, disturbing the crystallographic structure of the bottom layer 112, and/or reduce the rate of upward Cr-diffusion.

The Cr-comprising layer 116 may be a deposited layer of Cr, or of a Cr-comprising alloy such as NiCr, RuCr or PtCr. For an alloy composition, the Cr-content may advantageously be at least 50 atomic %. The Cr-comprising layer 116 (e.g. of Cr or CrX) may be formed with a thickness in the range of 0.2 to 2 nm, preferably in the range of 0.5 to 1.5 nm. The Cr-comprising layer 116 may serve as a Cr-source for diffusion of Cr into the pinning layer structure 120. More specifically, the Cr-comprising layer 116 may allow a thermally induced in-diffusion of Cr into the pinning layer structure 120, thereby counteracting an in-diffusion of Fe from the reference layer structure 130 into the pinning layer structure 120. As such, in some embodiments, a concentration of Fe in the pinning layer structure 120 of the layer stack 108 as shown may be lower relative to a concentration of Fe in a pinning layer structure similar to that in the layer stack 108, but without the Cr-comprising layer 116.

According to an example of a preferred seed layer structure 110, the Ru-comprising layer 114 forms an interfacial layer between the bottom layer 112 and the Cr-comprising layer 116. That is, the Ru-comprising layer 114 may be formed on the bottom layer 112 and the Cr-comprising layer 116 may be formed on the Ru-comprising layer 114. In particular, the seed layer structure 110 may comprise or be formed of a Pt-, Pd- or Ir-bottom layer 112, a Ru-layer 114 on the bottom layer 112, and a Cr-comprising layer 116 (e.g., of Cr or CrX) on the Ru-layer 114, where the Cr-comprising layer 116 forms the upper layer of the seed layer structure 110. A bottom layer 112 of Pt, Pd or Jr (or a combination of such layers) may provide a (111) face-centered cubic (FCC)-textured upper surface for the Ru-layer 114 which is lattice-matched with the (002) hexagonal close-packed (HCP) structure of the Ru-layer 114. This allows the (111) FCC texture-inducing/templating effect of the bottom layer 112 to be transferred to above layers, in particular to the pinning layer structure 120. Additionally, by confining the thickness of the Cr-comprising layer 116 to the above indicated ranges, it may be ensured that the texture-inducing effect of the seed layer structure is maintained to a sufficient degree. Although such a three-layered seed layer structure 110 may be considered a preferred example, it is possible to include one or more spacer layers in the seed layer structure 110, such as a thin layer of Co, Ni, NiCr, Jr or Pd between the Ru-comprising layer 114 and the Cr-comprising layer 116, e.g., for the purpose of tuning properties of the layer stack.

The pinning layer structure 120 is arranged or formed above the seed layer structure 110, preferably on the Cr-comprising layer 116 of the seed layer structure 110. The pinning layer structure 120 may comprise a laminate of Co and Pt, a laminate of CoFe and Pt, a laminate of Co and Ni, or a laminate of CoFe and Ni; or an alloy of Co and Pt, an alloy of CoFe and Pt, an alloy of Co and Ni, or an alloy of CoFe and Ni. As describe herein, a laminate may comprise a plurality of bi-layers (e.g., Co/Pt or Co/Ni). On the other hand, alloys refer to a mixture of elements in which the constituent elements are more homogeneously distributed throughout the pinning layer structure 120. In some embodiments, the pinning layer structure 120 may be formed as a ferromagnetic layer structure. Embodiments are not so limited, however, and a synthetic antiferromagnetic structure is also possible by the addition of one or more antiparallel coupling layers into the pinning layer structure 120.

As previously mentioned, it is expected that Cr diffusing from the Cr-comprising layer 116 of the seed layer structure 110 may diffuse into the pinning layer structure 120 in response to exposing the layer stack 108 to elevated temperatures. Hence, the pinning layer structure 120 may, at least subsequent to the layer stack 108 being subjected to an anneal step, comprise diffused Cr. Thus, according to embodiments, a diffusion profile characteristic of thermal diffusion may extend from the Cr-comprising layer 116 into the pinning layer structure 120. It is envisaged that the Fe-diffusion blocking function provided by the seed layer structure 110 may not completely prevent Fe in-diffusion. Hence, it is expected that the pinning layer structure 120 after such an anneal step also may comprise traces of Fe, although to a much lesser extent compared to had the seed layer structure 110 not been present.

The Fe-comprising reference layer structure 130 is arranged or formed above the pinning layer structure 120. The reference layer structure 130 may be formed on the pinning layer structure 120 or alternatively on an intermediate spacer layer (not shown in FIG. 1a), such as a parallel or antiparallel coupling layer or a texture-breaking layer. The reference layer structure 130 may comprise one or more ferromagnetic layers, at least one comprising Fe. Examples of layers for the reference layer structure 130 include Fe, Co, FeB, CoFe and CoFeB. However, also other compositions are possible such as combinations of layers of the aforementioned materials.

The tunnel barrier layer 140 is arranged or formed on the reference layer structure 130. The tunnel barrier layer 140 may include a layer of a dielectric oxide material, for instance MgO, $MgAlO_x$, $MgTiO_x$, or $MgGaO_x$ having a thickness adapted for direct tunneling of electrons therethrough.

The free layer structure 150 is arranged or formed on the tunnel barrier layer 140. The free layer structure 150 may similar to the reference layer structure 130. For example, the free layer structure 150 may comprise one or more ferromagnetic material layers. Examples of layers for the free layer structure 150 include Fe, Co, FeB, CoB, CoFe and CoFeB. Moreover, single as well as dual free layer structures are possible.

As indicated by the arrows in the pinning layer structure 120, the reference layer structure 130 and the free layer structure 150, respectively, the magnetic layer structures of the layer structure 130 may each be layer structures possessing at least to some extent a perpendicular magnetic anisotropy (PMA). However, an in-plane magnetic anisotropy is also possible. In any case, the respective magnetization directions of the pinning, reference and free layer structures may be set by applying appropriately oriented magnetic fields during device fabrication, as per se is known in the art.

The free layer structure 150 has a net magnetization which may be varied. That is, the direction of the net magnetization/net magnetic moment of the free layer structure 150 may be varied. Meanwhile, the reference layer structure 130 has a net magnetization which is fixed or pinned by the pinning layer structure 120. Through the "pinning effect" exerted on the reference layer structure 130 by the pinning layer structure 120, the reversal field of the reference layer structure 130 may be increased to exceed the reversal field of the free layer structure 150. As indicated by the two oppositely oriented arrows in the free layer structure 150 in FIG. 1b, the magnetization of the free layer structure 150 may be varied between two states, a "parallel" state (wherein the magnetization of the free layer structure 150 is oriented parallel to or at least along the magnetization direction of the reference layer structure 130) and an "anti-parallel" state (wherein the magnetization of the free layer structure 150 is oriented anti-parallel to or at least against the magnetization direction of the reference layer structure 130). The magnetization directions of the pinning layer structure 120 and the reference layer structure 130 may, as indicated by the respective arrows in FIG. 1b, be aligned with each other. However, an opposite orientation is also possible in case of an anti-parallel magnetization coupling between the pinning and reference layer structures 120, 130.

As shown in FIG. 1a, a top electrode layer 194 may be formed above the free layer structure 150. The top electrode 194 may be a deposited layer of Ru, or some other suitable top electrode material such as Ta, CoFeB, Mo, W, Jr or laminates such as Ta/Ru, CoFeB/Ta, Mo/Ru, to name a few examples. The top electrode 194 may be formed with a thickness of at least 1 nm.

Subsequent to forming layer stack 108, an annealing step may be performed. The annealing may include subjecting the stack of layers to a temperature in the range of 250° C. to 450° C. The temperature here refers to an ambient temperature in a reactor or furnace. The anneal step may trigger the crystallization of the free layer structure 150 and the reference layer structure 130. As discussed above, the anneal step may additionally trigger Cr-diffusion from the Cr-comprising layer 116 into the pinning layer structure 120, thereby counteracting in-diffusion of Fe from the reference layer structure 130, which also may be triggered by the anneal. It is also possible to perform a respective separate anneal step subsequent to one or more of: forming the pinning layer structure 120, forming the reference layer structure 130, forming the tunnel barrier layer 140 and forming the free layer structure 150. Each of the anneal steps may trigger crystallization of the respective layer structures, and additionally trigger Cr- and Fe-diffusion as discussed.

As shown in FIG. 1b, the layer stack 108 may be patterned to form one or more MTJ device pillar structures 100. The patterning may be performed prior to or subsequent to performing the afore-mentioned anneal step(s). The layer stack 108 may be patterned such that each pillar structure formed includes a (respective) patterned portion of the layers and layer structures of the initial layer stack 108.

The pillar structures may be patterned by forming a mask above the layer stack 108 shown in FIG. 1a. The mask may be formed by, e.g., silicon oxide, silicon oxide nitride, silicon carbide nitride or silicon nitride. The mask may be a hard mask. Examples of hard mask materials include Ta, TiN, TaN, TiTaN and spin-on-carbon as well as spin-on-glass materials. A mask layer may be deposited above the layer stack 108. The mask may be defined by patterning a photo resist formed on the mask layer, and transferring the pattern of the photo resist to the mask layer may be performed by etching. The mask may, for instance, be patterned to a rectangular shape, an oval shape or a circular shape, as viewed in a top-down direction. The hard mask patterning may be performed by lithography methods such as UV lithography, deep UV lithography, extreme UV lithography, nano-imprint lithography (NIL) or electron beam lithography (EBL). The pattern of the mask may subsequently be transferred to the layer stack 108 by etching regions of the layer stack 108 which are exposed by the mask. The layer stack 108 may, for example, be patterned using in an anisotropic etch process such as a reactive-ion-etching (RIE) process or an ion-beam-etching (IBE) process. The layer stack 108 may be etched until the pattern has been transferred to at least parts of or to the layer stack 108 in its entirety including any eventual bottom and top electrode layers 192, 194. FIG. 1b shows an example of a complete pattern transfer. Other examples may see the bottom electrode layer 192 layer being kept non-etched in order to optimize or simplify device interconnection. It should be noted that more than one MTJ device pillar structure 100 may be formed by forming a mask including one mask portion for each pillar to be formed.

Subsequent to patterning the layer stack 108, (further) conventional BEOL-processing may be performed to integrate the one or more MTJ device pillar structures 100 in a functional circuit. For instance, one or more dielectric layers (such as a silicon oxide or other low-k dielectrics) may be deposited over the pillar structure(s) 100, as schematically indicated by reference sign 104. Metal lines and vias (exemplified by reference sign 196 in FIG. 1b) connecting to the top electrode layer 194 may be formed in the dielectric layer. Metal lines and vias may for instance be formed in a dual damascene process. Due to the presence seed layer structure 110, diffusion of Fe into the pinning layer structure 120 may be avoided during the BEOL-processing, as discussed above.

The structure as shown in FIG. 1b may form part of an MTJ device. The MTJ device may for example be used in an MRAM, or in a spin logic circuit, wherein the magnetization direction is switched by an external magnetic field generated by currents flowing in vicinity of the pillar(s) 100 of the MTJ device. The device may advantageously be used in conjunction with STT-type switching, wherein the magnetization direction of the free layer structure 150 is switched through spin-transfer-torque (STT), as per se is known in the art. Optionally, the layer stack 108 may be formed to further include a spin-orbit-torque (SOT)-generating layer above the free layer structure 150, adapted to exert a spin-orbit torque on the magnetic moments of the free layer structure 150 in response to an SOT-switching current, as per se is known in the art. A SOT-generating layer may by way of example be formed by a SOT-generating metal layer of a thickness of one to a few nanometers or a similarly thin layer of a topological insulator. Such a device may thus be used in a spin logic circuit or an MRAM of an SOT-type. As is known in the art, it is further possible to use the STT- and SOT-effect in conjunction to enable faster switching of the magnetization direction of the free layer structure 150.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A layer stack for a magnetic tunnel junction (MTJ) device, the layer stack comprising:
    a seed layer structure;
    a pinning layer structure arranged above the seed layer structure; and
    a Fe-comprising reference layer structure and a free layer structure separated by a tunnel barrier layer, formed above the pinning layer structure, wherein the Fe-comprising reference layer structure contacts the pinning layer structure, and wherein the seed layer structure comprises a Ru-comprising layer and a Cr-comprising layer, the Cr-comprising layer forming an upper layer of the seed layer structure.

2. The layer stack according to claim 1, wherein the Cr-comprising layer is arranged on the Ru-comprising layer.

3. The layer stack according to claim 1, wherein the pinning layer structure is formed on the Cr-comprising layer.

4. The layer stack according to claim 1, wherein the Ru-comprising layer has a thickness of 0.2 to 3 nm and the Cr-comprising layer has a thickness of 0.2 to 2 nm.

5. The layer stack according to claim 1, wherein the seed layer structure further comprises a Pt-, Pd- or Ir-comprising bottom layer arranged below the Ru-comprising layer.

6. The layer stack according to claim 5, wherein the bottom layer has a thickness of 1 to 6 nm.

7. The layer stack according to claim 5, wherein the Ru-comprising layer forms an interfacial layer between the bottom layer and the Cr-comprising layer.

8. The layer stack according to claim 5, wherein the bottom layer has a face-centered cubic (FCC) structure and has a (111)-textured surface.

9. The layer stack according to claim 8, wherein the Ru-comprising layer comprises a (002) surface contacting the (111)-textured surface of the bottom layer.

10. The layer stack according to claim 1, wherein the pinning layer structure comprises a Co/Pt laminate, a Co/Ni laminate, a CoFe/Pt laminate, a CoFe/Ni laminate, a CoPt alloy, a CoFePt alloy, a CoNi alloy or a CoFeNi alloy.

11. The layer stack according to claim 1, wherein the pinning layer structure comprises Cr.

12. The layer stack according to claim 11, wherein a diffusion profile characteristic of thermal diffusion extends from the Cr-comprising layer and into the pinning layer structure.

13. The layer stack according to claim 1, wherein the reference layer structure comprises a CoFeB layer, FeB layer, CoFe layer or Fe layer.

14. The layer stack according to claim 13, wherein the Cr-comprising layer serves to suppress diffusion of Fe from the reference layer structure to the pinning layer.

15. The layer stack according to claim 1, wherein the pinning layer structure comprises grain boundaries occupied by Cr.

16. A method for forming a layer stack for a magnetic tunnel junction (MTJ) device, the method comprising:
forming a seed layer structure;
forming a pinning layer structure above the seed layer structure;
forming, above the pinning layer structure a Fe-comprising reference layer structure, a tunnel barrier layer, and a free layer structure,
wherein the Fe-comprising reference layer structure contacts the pinning layer structure, and
wherein forming the seed layer structure comprises forming a Ru-comprising layer and a Cr-comprising layer, wherein the Cr-comprising layer forms an upper layer of the seed layer structure; and
performing an anneal process to cause diffusion of Cr from the Cr-comprising layer into the pinning layer structure.

17. The method according to claim 16, further comprising patterning the layer stack to form a pillar structure prior to or subsequent to performing the anneal process.

18. The method according to claim 16, wherein the Cr-comprising layer is formed on the Ru-comprising layer.

19. The method according to claim 16, wherein forming the seed layer structure further comprises forming a Pt-, Pd- or Ir-comprising bottom layer and subsequently forming the Ru-comprising layer above the bottom layer.

20. The method according to claim 19, wherein the Ru-comprising layer is formed on the bottom layer.

* * * * *